United States Patent [19]
Tsai et al.

[11] Patent Number: 5,617,328
[45] Date of Patent: Apr. 1, 1997

[54] AUTOMATIC CODE PATTERN GENERATOR FOR REPETITIOUS PATTERNS IN AN INTEGRATED CIRCUIT LAYOUT

[75] Inventors: Chiu-Mei Tsai, Taichung; Mei-Ling Kuo, Kaohsiung; Kuo-Chih Huang, Hsin-Chu, all of Taiwan

[73] Assignee: Winbond Electronics Corporation, Hsinchu, Taiwan

[21] Appl. No.: 248,068

[22] Filed: May 23, 1994

[51] Int. Cl.$^6$ .................................................. H01L 21/70
[52] U.S. Cl. .................................................. 364/490
[58] Field of Search ................................... 364/488, 489, 364/490, 491; 437/43; 178/19; 250/492.3

[56] References Cited

U.S. PATENT DOCUMENTS

| | | | |
|---|---|---|---|
| 4,580,228 | 4/1986 | Noto | 364/491 |
| 4,851,365 | 7/1989 | Jeuch | 437/43 |
| 4,922,432 | 5/1990 | Kobayashi et al. | 364/490 |
| 4,950,910 | 8/1990 | Yasuda et al. | 250/492.3 |
| 5,005,136 | 4/1991 | Van Berkel et al. | 364/490 |
| 5,008,830 | 4/1991 | Moriizumi et al. | 364/490 |
| 5,051,545 | 9/1991 | McDermott | 178/19 |
| 5,097,422 | 3/1992 | Corbin, II et al. | 364/491 |
| 5,144,563 | 9/1992 | Date et al. | 364/491 |
| 5,253,182 | 10/1993 | Suzuki | 364/489 |
| 5,315,534 | 5/1994 | Schlachet | 364/490 |

Primary Examiner—Kevin J. Teska
Assistant Examiner—Dan Fiul
Attorney, Agent, or Firm—Meltzer, Lippe, Goldstein, et al.

[57] ABSTRACT

An automatic code pattern generator apparatus is disclosed which has a processor. The processor is for receiving a plurality of instructions including an instruction indicating a particular polygon specification associated with cells of at least one physical layer of a pre-programmed integrated circuit chip. The processor also receives at least one instruction indicating a regular ordered pattern of a plurality of the cells on the physical layers of the pre-programmed integrated circuit chip. The processor generates a code layer including a design of a layout of the polygons according to the regularly ordered pattern on the physical layers of the pre-programmed integrated circuit. The generated code layer also includes a mapping relationship between cell addresses, and corresponding ones of the cells associated with the polygons. The processor may also receive information indicating variations in particular addressed cells associated with the polygons of the regularly ordered pattern of cells. In response to this information, the processor modifies the design of the layout to include variations in the particular addressed cells, e.g., variations in the polygons associated with the particular addressed cells, according to the information.

14 Claims, 7 Drawing Sheets

```
SCALE = 1000;

WINDOW (150000, 150000, 2520000, 3740000);

STRING
{
    LOGO_STRING (46, 13980000, 37050000, 1650000, 3730000);
}

CODE (NA5209XXX, 0, 0)
{
    FILL = 0;
    ADDRESS_NO = 17;
    DATA_BIT = 8;
    CODE_CELL
    {
        ROM (16, 2100, 1600);
    }
    X( 0-6, B(0-7) );
    Y( F(C(7-14)), 15, 16 );
    bx = 280500;
    REPEAT
    {
        dx =  2000    STEP 127;
        dx = 10300;
        dx =  2000    STEP 127;
        dx =  2700;
        dx =  2000    STEP 127;
        dx = 10300;
        dx =  2000    STEP 127;
        dx = 15200;
        dx =  2000    STEP 127;
        dx = 10300;
        dx =  2000    STEP 127;
        dx =  2700;
        dx =  2000    STEP 127;
        dx = 10300;
        dx =  2000    STEP 127;
    }
    by = 1907700;
    REPEAT
    {
        dy =  1600    STEP 255;
        dy = 55800;
        dy =  1600    STEP 255;
        dy = 24800;
        dy =  1600    STEP 255;
        dy = 55800;
        dy =  1600    STEP 255;
    }
}
```

FIG. 3B

```
DECODER ( x_DECODER1, 0)
{
    FILL = 0;
    DATA_BIT = 7;
    CODE_CELL
    {
        XDEC1 (16, 2100, 1600);
    }
    Y( 0 - 127 );
    bx = 280500;
    REPEAT
    {
        dx =  2000    STEP 127;
        dx = 10300;
        dx =  2000    STEP 127;
        dx =  2700;
        dx =  2000    STEP 127;
        dx = 10300;
        dx =  2000    STEP 127;
        dx = 15200;
        dx =  2000    STEP 127;
        dx = 10300;
        dx =  2000    STEP 127;
        dx =  2700;
        dx =  2000    STEP 127;
        dx = 10300;
        dx =  2000    STEP 127;
    }
    by = 2318900;
    REPEAT
    {
        dy = 3200    STEP 6;
    }
}

DECODER ( x_DECODER1N, 0)
{
    FILL = 0;
    DATA_BIT = 7;
    CODE_CELL
    {
        XDEC1N (16, 2100, 1600);
    }
    Y( 127 - 0 );
    bx = 280500;
    REPEAT
    {
```

```
        dx =  2000   STEP 127;
        dx = 10300;
        dx =  2000   STEP 127;
        dx =  2700;
        dx =  2000   STEP 127;
        dx = 10300;
        dx =  2000   STEP 127;
        dx = 15200;
        dx =  2000   STEP 127;
        dx = 10300;
        dx =  2000   STEP 127;
        dx =  2700;
        dx =  2000   STEP 127;
        dx = 10300;
        dx =  2000   STEP 127;
    }
    by = 2317300;
    REPEAT
    {
        dy = 3200    STEP 6;
    }
  }
}

DECODER ( x_DECODER2, 3)
{
    FILL = 0;
    DATA_BIT = 7;
    CODE_CELL
    {
```

```
na5209 REQUEST FORM                        DATE:  /  /

TO:                    FORM:                REQUEST DATE:

TYPE NO:          CUSTOMER NO:            VERSION:

SOURCE MEDIUM:         RETURN MEDIUM:

SPK CURRENT    :  [] CUR_5MA (30 SQ  [] CUR_3MA (46 SQ  [] 33SQ  [] 36 SQ
                  [] 48 SQ           [] 50 SQ
LED FLASH FREQ :  [] LED_3Hz         [] LED_6Hz         [] LED_0Hz
LED FLASH TYPE :  [] LED_ASYN        [] LED_SYN
LED1 SECTION CONTROLLED :  [] LED1_S_CTL  [] LED1_S_OFF
LED2 CONTROL TYPE :  [] LED2_S_CTL  [] LED2_STC
```

FIG. 5

```
OPTIONS
{
    SCALE = 1;
    LAYER = 16;

OPTION ( SPK CURRENT )
    {
        CASE   CUR_5mA         : BOX (1858.00,  196.50, 1863.00,  199.50);
        CASE   CUR_3mA(45 SQ)  : BOX (1663.00,  196.50, 1668.00,  199.50);
        CASE   30 SQ           : BOX (1911.00,  196.50, 1916.00,  199.50);
        CASE   36 SQ           : BOX (1805.00,  196.50, 1810.00,  199.50);
        CASE   46 SQ           : BOX (1710.00,  196.50, 1715.00,  199.50);
        CASE   50 SQ           : ;
    }

OPTION ( LED FLASH FREQ )
    {
        CASE   LED_3Hz  : BOX (880.00, 1449.50,  885.00, 1452.00);
                          BOX (836.00, 1449.50,  841.00, 1452.00);
        CASE   LED_6Hz  : BOX (865.00, 1449.50,  870.00, 1452.00);
                          BOX (850.00, 1449.50,  855.00, 1452.00);
        CASE   LED_0Hz  : BOX (872.50, 1449.50,  877.50, 1452.00);
                          BOX (843.00, 1449.50,  848.00, 1452.00);
    }

OPTION ( LED FLASH TYPE )
    {
        CASE LED_ASYN  : BOX (762.50, 1455.50,  767.50, 1458.00);
        CASE LED_SYN   : BOX (755.50, 1455.50,  760.50, 1458.00);
    }

OPTION ( LED1 SECTION_CONTROLLED )
    {
        CASE LED1_S_CTL : BOX (759.00, 1341.00,  764.00, 1343.50);
        CASE LED_S_OFF  : BOX (759.00, 1349.50,  764.00, 1352.00);
    }

OPTION ( LED2 CONTROL TYPE )
    {
        CASE LED2_S_CTL : BOX (762.00, 1431.00,  764.50, 1436.00);
        CASE LED2_STC   : BOX (753.50, 1431.00,  756.00, 1436.00);
    }
}
```

AUTOMATIC CODE PATTERN GENERATOR FOR REPETITIOUS PATTERNS IN AN INTEGRATED CIRCUIT LAYOUT

FIELD OF THE INVENTION

The present invention relates to integrated circuit layout, design and fabrication. In particular, the present invention relates to an integrated circuit design tool which automates the layout of pre-programmed integrated circuit (IC) regions and components. Such IC's are designed by first creating a basic layout design with components and regions laid out in a regular, repeated or ordered physical pattern on the IC. Variations in this basic layout are then introduced in the design. The invention facilitates forming the layout design model and introducing variations into the model to suit specific applications.

BACKGROUND OF THE INVENTION

Figure 1:
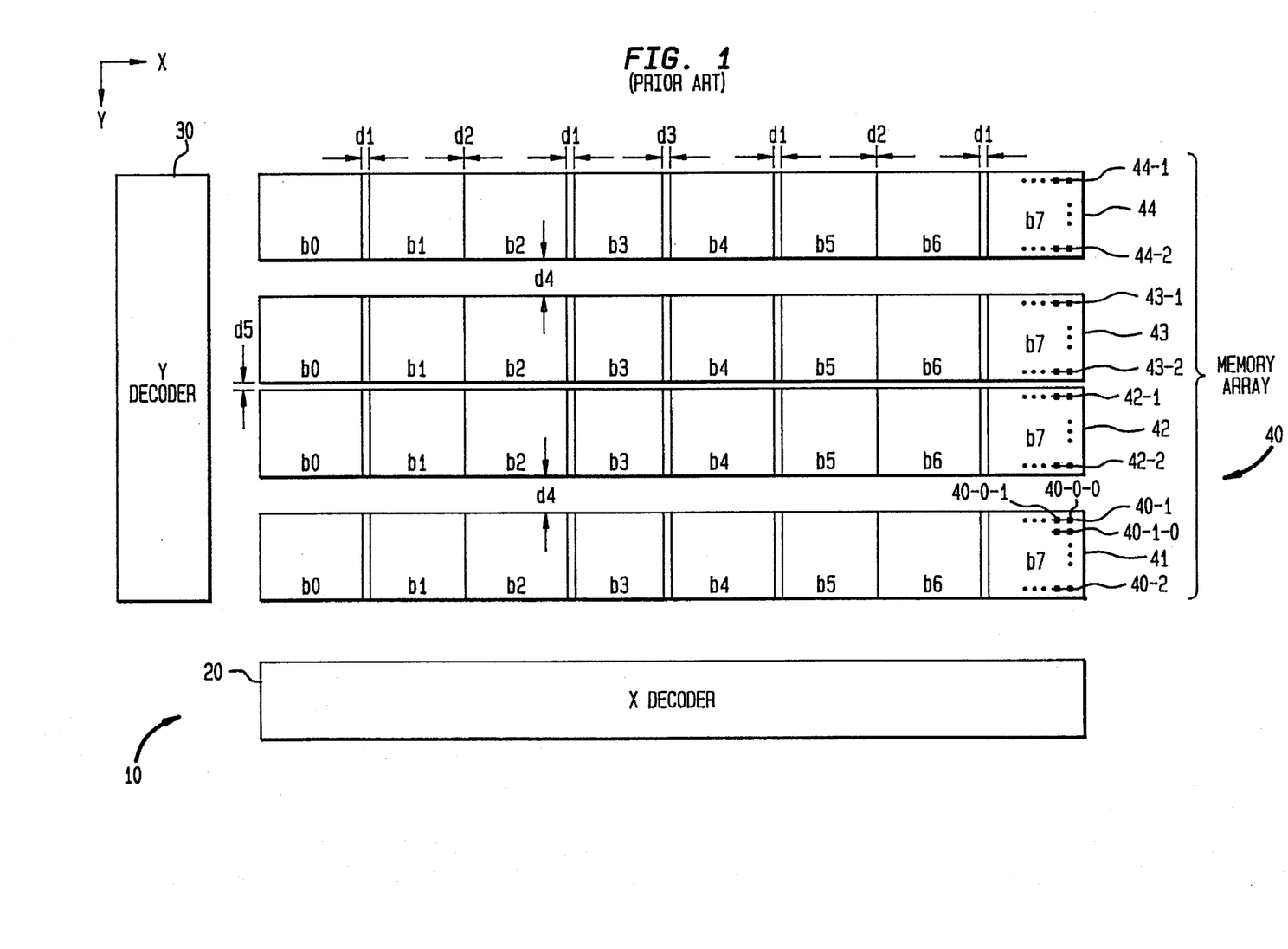
FIG. 1 shows a conventional ROM IC layout design.

Certain "pre-programmed" ICs have a regularly repeated or ordered physical structure. For instance, ROMs, speech synthesizers and melody synthesizers include a number of regions which can be divided into two-dimensional arrays of cells. Each cell within a specific region has a very similar physical structure. For example, FIG. 1 shows part of the design of a layout of a ROM IC 10 called a "code layer". (Herein, "layout" means the physical location and arrangement of IC components and regions on a physical layer of an IC chip. "Design" means a geometrical description of the physical locations of components and regions of a layout.) The code layer includes, an X decoder region 20, a Y decoder region 30 and a memory array region 40. Each of these regions 20, 30 and 40 has a regular, two-dimensionally repeated order. For instance, the memory array 40 has four sub-arrays 41, 42, 43, and 44. Each sub-array 41, 42, 43, and 44 is divided into eight areas b0, b1, b2, b3, b4, b5, b6, and b7. Each of the areas b0–b7 contains a row-column layout of storage cells, e.g., 40-0-0, 40-0-1, ..., 40-1-0, ..., which store bits of the eight bit data words stored in the memory array 40. Each area b0–b7 has cells for storing one particular bit of the eight bits of each eight bit data word. There are 128 cells in the x (horizontal) direction in each area b0–b7 (for storing one bit of each of 128 eight bit data words) and 256 cells in the y (vertical) direction in each area b0–b7 of each sub-array 41–44.

The above-mentioned IC devices (ROM, speech synthesizer, etc.) are "pre-programmed" in the sense that they are fabricated by introducing variations into a general layout design, such as the general ROM layout design 10 shown in FIG. 1. For instance, the ROM IC 10 is designed using the general ROM IC model 10. The ROM 10 permanently stores particular data in corresponding cells 40-0-0, 40-0-1, ..., 40-1-0, ..., etc. The permanent storage of data is achieved by varying the fabrication of each cell depending on whether a logic '1' or a logic '0' is to be stored in the corresponding cell. The particular variations in the fabrication of the cells depend on the type of ROM characteristics (e.g., cost, speed, power dissipation) desired in the design. For instance, according to one cell architecture, a transistor is placed in each cell that stores a logic '1' bit and no transistor is placed in each cell which stores a logic '0' bit. According to an alternative architecture, a transistor may be placed in each cell. However, those cells which store a logic '1' bit are fabricated (i.e., using an ion implantation fabrication step) so that they are permanently turned on while the cells which store a logic '0' bit are fabricated so that they are permanently turned off. In yet another alternative architecture, the storage of logic '1' and '0' bits is achieved by contact programming, i.e., by connecting the cells which store one logic bit value (e.g., logic '1') to the word and bit lines but not connecting the cells which store the other logic bit value (e.g., logic '0').

The task of designing a ROM, speech synthesizer, melody synthesizer, or other regularly ordered pre-programmed IC is often divided into a circuit design task and a programming task. For example, in the design of the ROM IC 10, circuit designers design the layout of the regions and components (e.g., the cells) on each physical layer of the IC chip. In designing the model ROM IC layout, the circuit designers determine the number of bits per addressed data word, the number of addressed data words, the total number of addresses and address bits and how those address bits are allocated to the X decoder and Y decoder for addressing individual cells of the layout. After making these determinations, the circuit designers draft a code layer which includes a design of the layout of regions and components on a physical layer, or physical layers, of the pre-programmed IC chip. In particular, the code layer includes a design of the layout of polygons corresponding to each cell of the pre-programmed IC chip at their respective physical locations on the physical layer or layers of the pre-programmed IC chip. Advantageously, the "design" is in the form of a database. The circuit designers typically write a new computer program in the C computer programming language for generating the code layer of each specific pre-programmed IC chip.

After completing the code layer, the circuit designers determine the mapping between addresses of addressed cells (which each correspond to one bit) and their corresponding cells. The circuit designers file a document with the programmers indicating the mapping relationships between addresses of cells and the cells themselves as laid out on the physical layer or layers of the ROM IC. The programmers study the code layer and mapping relations in order to discuss with the circuit designers the suitability of the physical implementation of the pre-programmed IC chip for a particular application. Because of the complexity of the mapping relations, the mapping relations are both difficult to document accurately and to understand. As a result, a long time is usually expended in reaching a consensus between the circuit designers and the programmers regarding the design of the pre-programmed IC chip. When a consensus is reached, the programmers introduce design variations into the code layer to suit a particular application. In the case of a ROM IC, the design variations are introduced (for producing appropriate physical variations as described above) in order to form a pre-programmed IC chip design which stores particular data. Again, this is achieved by modifying the specific C computer program used to generate the code layer.

Afterward, the database of the code layer is merged with the database of the other physical layers of the pre-programmed IC chip to form a complete chip layout design database. Thereafter, the complete chip design thus formed by the merger may be verified using a layout editor or by examining the whole chip layout design. If the layout of all of the physical layers of the ROM IC do not match each other, the layout is determined to be defective and is sent back to the design process for correction.

The problem with the conventional design approach is that it is time consuming and error prone. Both circuit designers and programmers must generate many lines of C computer program code which is both tedious and difficult to analyze. Because many lines of computer code are required, and because complex mapping relationships are often employed, errors can occur very easily but are difficult to locate and correct. Furthermore, simple conceptual changes in the design can lead to many computer code line changes.

It is therefore an object of the present invention to overcome the disadvantages of the prior art.

SUMMARY OF THE INVENTION

This and other objects are achieved by the present invention which provides an automatic code pattern generator apparatus for automatically producing a layout design of a code layer of a pre-programmed IC chip. Basically, the inventive apparatus utilizes instructions of a higher, more abstracted level than C program instructions. The higher level instructions utilized by the apparatus according to the present invention are also specifically suited for defining polygon shapes, their physical two-dimensional layout on the physical layers of the pre-programmed IC according to a regular ordered pattern and the mapping between addresses and addressed cells associated with each polygon of the layout.

According to one embodiment, the automatic code pattern generator apparatus is provided with a processor. The processor receives a plurality of instructions defining the physical layout of regularly repeated or ordered regions and components on one or more physical layers of an IC chip. Illustratively these instructions include an instruction selecting a particular polygon specification (e.g., number sides and dimensions of each side) associated with each cell of the layout. Also included, is at least one instruction defining a regular ordered pattern of the cells, i.e., the number and two dimensional layout of the cells, on one or more physical layers of the IC chip. In response thereto, the processor illustratively generates a code layer which includes:

(1) a design of the physical layout of the polygons on a respective physical layer of the IC chip according to the regularly repeated pattern of cells; and (2) the mapping relationship between cell addresses and their corresponding cells associated with particular polygons in the design layout, i.e., in the regularly repeated pattern.

Illustratively, the processor may then receive information indicating variations to be introduced into the cells of the physical layer or layers of the IC chip. This information may simply be data indicating variations and corresponding addresses of the cells to be varied. The processor uses the mapping relationship to determine the particular cells to be varied. The processor then varies the corresponding cells according to one of a number of selectable cell architectures. For example, the processor may also determine the particular polygons corresponding to the cells to be varied. The processor may then introduce variations into the design of the layout of the polygons, such as by deleting particular varied polygons, depending on the data.

The code layer thus formed may be merged with other IC layer information to form a completed IC chip layout design. The completed layout design may then be transferred to a layout editor, examined in whole, or inputted to one or more apparatuses used in fabricating semiconductor IC chips, such as an apparatus which creates photolithographic masks. The pre-programmed IC chip can the be fabricated according to the completed layout design.

In short, an automatic pre-programmed IC layout apparatus is provided. The inventive apparatus provides the following advantages:

(1) The instructions inputted to the apparatus are both highly specialized to designing an IC chip layout and are on a higher level of abstraction. Thus, fewer (i.e., about 100) lines of instruction are necessary than in the prior art C computer programming method (wherein typically thousands of lines are required). Thus, the time required to generate the circuit design is dramatically reduced. Furthermore, the circuit design is easier to understand, correct and modify.

(2) The mapping between addresses and the addressed cells is automated. The apparatus not only determines the mapping relations but also automatically maps addressed data (specifying variations in corresponding cells) to the cells corresponding to the addresses. This minimizes human error and reduces the time required to perform the programming step.

(3) Simple conceptual changes to the layout design, e.g., changing the repeated ordering of cells, can be easily accomplished by changing few or even a single instruction.

DETAILED DESCRIPTION OF THE INVENTION

Figure 2:
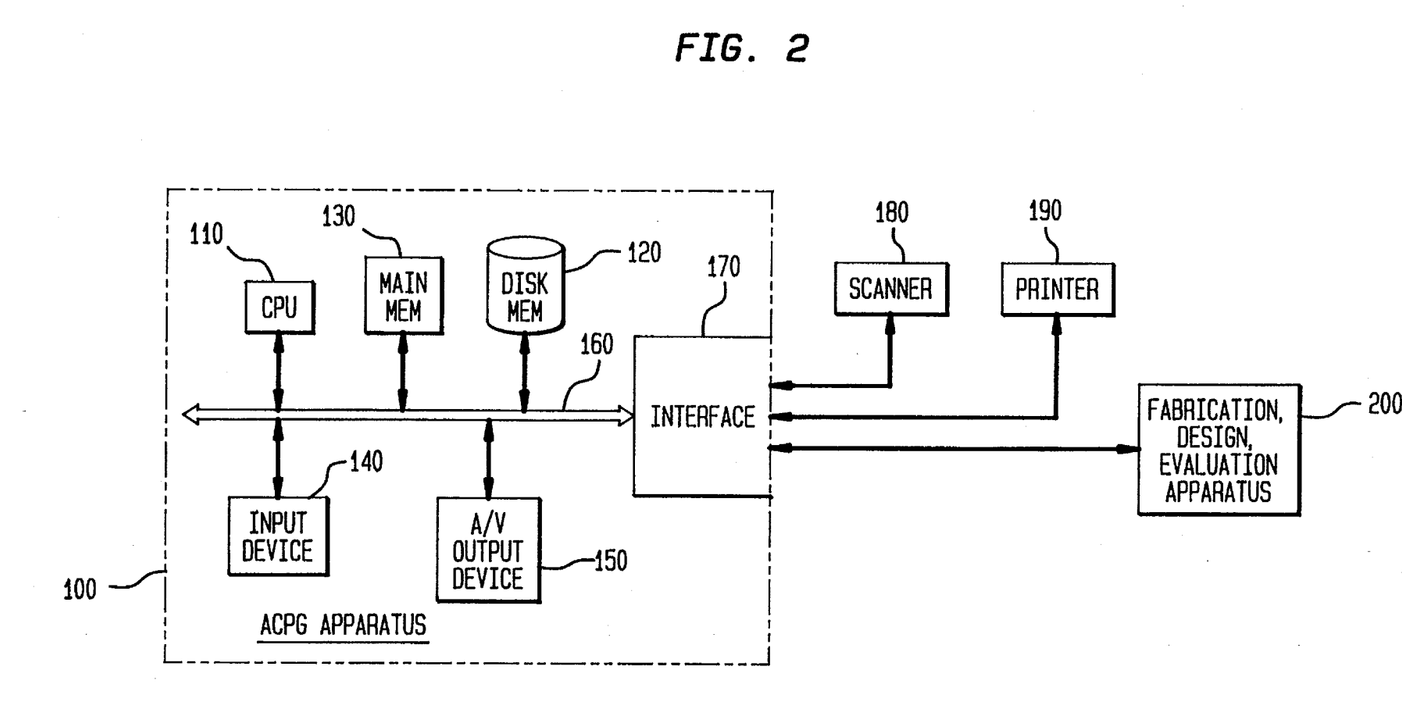
FIG. 2 shows an automatic code pattern generator apparatus according to one embodiment of the present invention.

FIG. 2 shows a circuit diagram of an automatic code pattern generator (ACPG) apparatus 100 according to one embodiment of the present invention. The ACPG apparatus 100 has a processor or CPU 110 which executes instructions. The ACPG apparatus 100 also has a disk memory 120 and a main memory 130. These memories 120 and 130 are for storing instructions and data, including, modules executed in response to certain instructions, polygon specifications (number of sides, dimensions, etc.), interim results, code layers, other layer information and completed layout designs. Additionally, the ACPG apparatus 100 has an input device 140 such as a keyboard and mouse for receiving instructions and commands inputted from a user. Likewise, the ACPG apparatus 100 includes an audio/video output device 150, e.g., a cathode ray tube and speakers, for outputting information to a user. A bus 160 is provided in the ACPG apparatus 100 which interconnects each of the above devices 110, 120, 130, 140 and 150 for purposes of conveying data, instructions and commands therebetween. An interface 170, is illustratively connected to the bus 160. The interface 170 provides for connecting another device, such as an optical scanner 180, a printer 190, or apparatus used in the design, evaluation, or fabrication of a semiconductor IC chip 200, to the ACPG apparatus 100.

As a particular illustration of the ACPG apparatus 100, the layout of the ROM IC 10 of FIG. 1 (i.e., the memory array 40) using the ACPG apparatus 100 is now discussed. In particular, the ACPG apparatus 100 can select a particular polygon specification and design the layout of one or more physical layers of the portion of the ROM IC 10 corresponding to the memory array 40. Those having ordinary skill in the art may appreciate that the ACPG apparatus 100 may be used to design the layout of any regularly ordered regions or components of a pre-programmed IC chip.

In the layout of the cells, it is important to account for the spacing of individual cells within each area of the physical layers and the spacing between respective areas. For instance, the sub-arrays 41–44 are separated from each other by distances d4 (between sub-arrays 41 and 42 and between sub-arrays 43 and 44) and d5 (between sub-arrays 42 and 43). The areas b0–b7 are also separated from each other by varying distances d1 (between areas b0 and b1, between areas b2 and b3, between areas b4 and b5, and between areas b6 and b7), d2 (between areas b1 and b2 and between areas b5 and b6) and d3 (between areas b3 and b4).

Furthermore, the correspondence (i.e., mapping) between addressed cells and their physical location can vary according to a complicated layout scheme. For instance, in each sub-array 41–44 there are 128 cells in the x (horizontal) direction and 256 cells in the y (vertical) direction in each area b0–b7 of each sub-array 41–44. Because there are 128 cells in each area b0–b7 and 256 cells in each of the four sub-arrays 41–44, and because each data word is eight bits (one bit from each area b0–b7), there are 17 address bits. Seven of the address bits (numbered 0–6) are decoded at the X decoder 20. Ten of the address bits (numbered 7–16) are decoded at the Y decoder 30 wherein the bits 15 and 16 select one of the four sub-arrays 41–44. In the ROM IC layout design 10, the Y decoder 30 addresses the rows of cells in the sub-arrays 41 and 43 from the upper rows 41-1 or 43-1 to the lower rows 41-2 or 43-2 as address thereof increase. In contrast, the Y decoder 30 addresses the rows of cells in the sub-arrays 42 and 44 from the lower rows 42-2 or 44-2 to the upper rows 42-1 or 44-1.

Figure 3A:
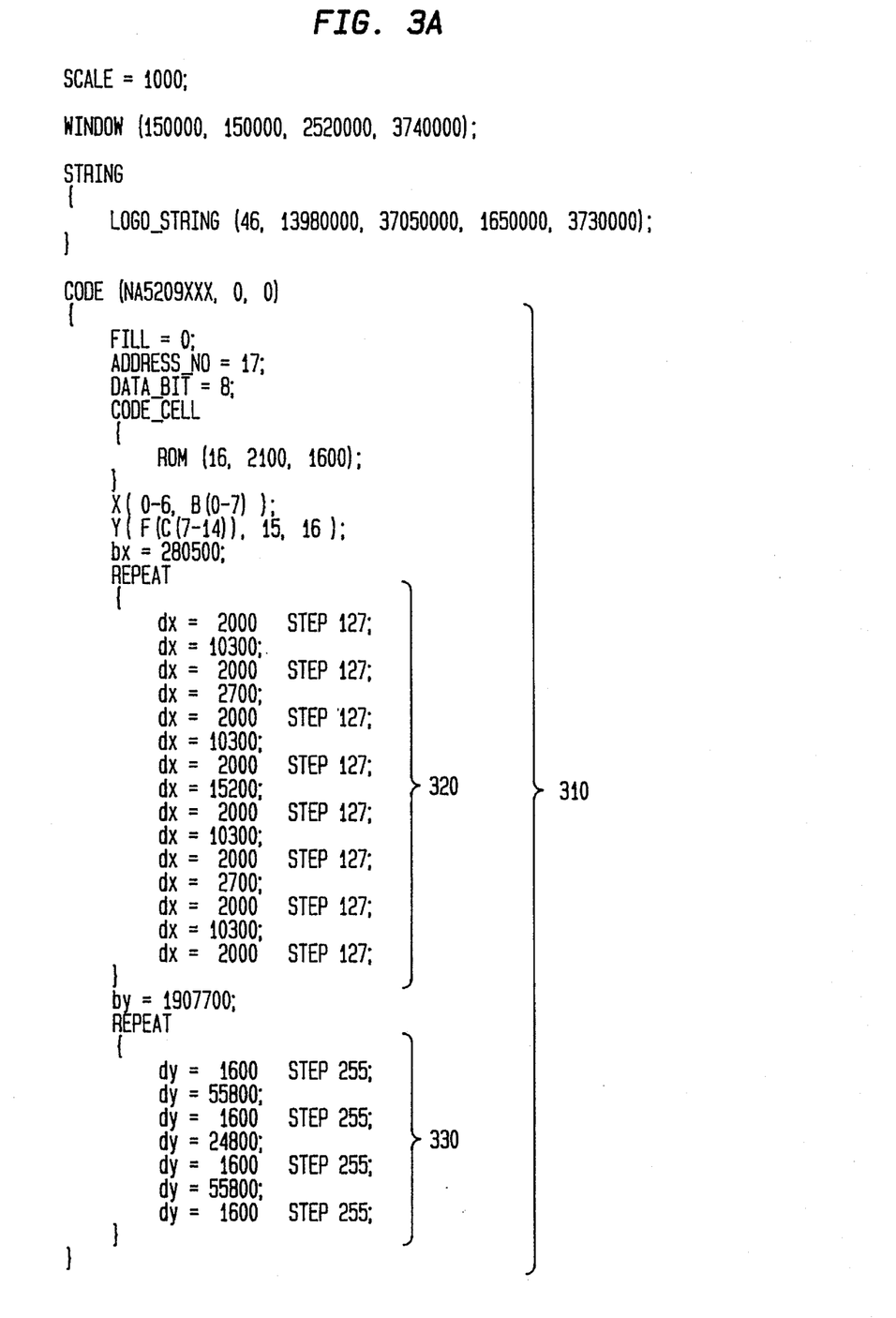
FIG. 3 shows instructions which may be executed by the automatic code pattern generator apparatus of the present invention to generate the ROM IC layout design of FIG. 1.
Figure 3B:
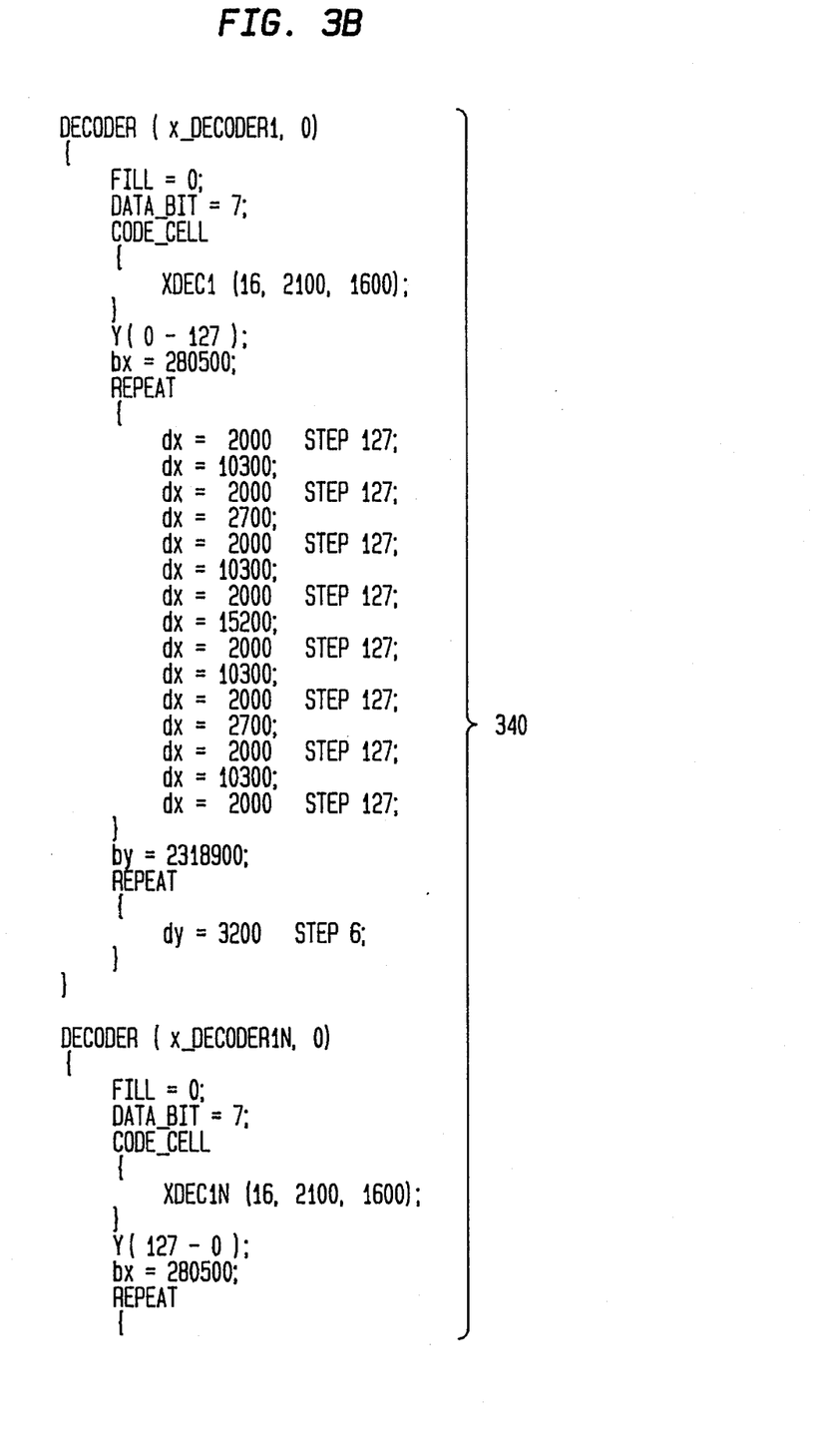
Figure 3C:
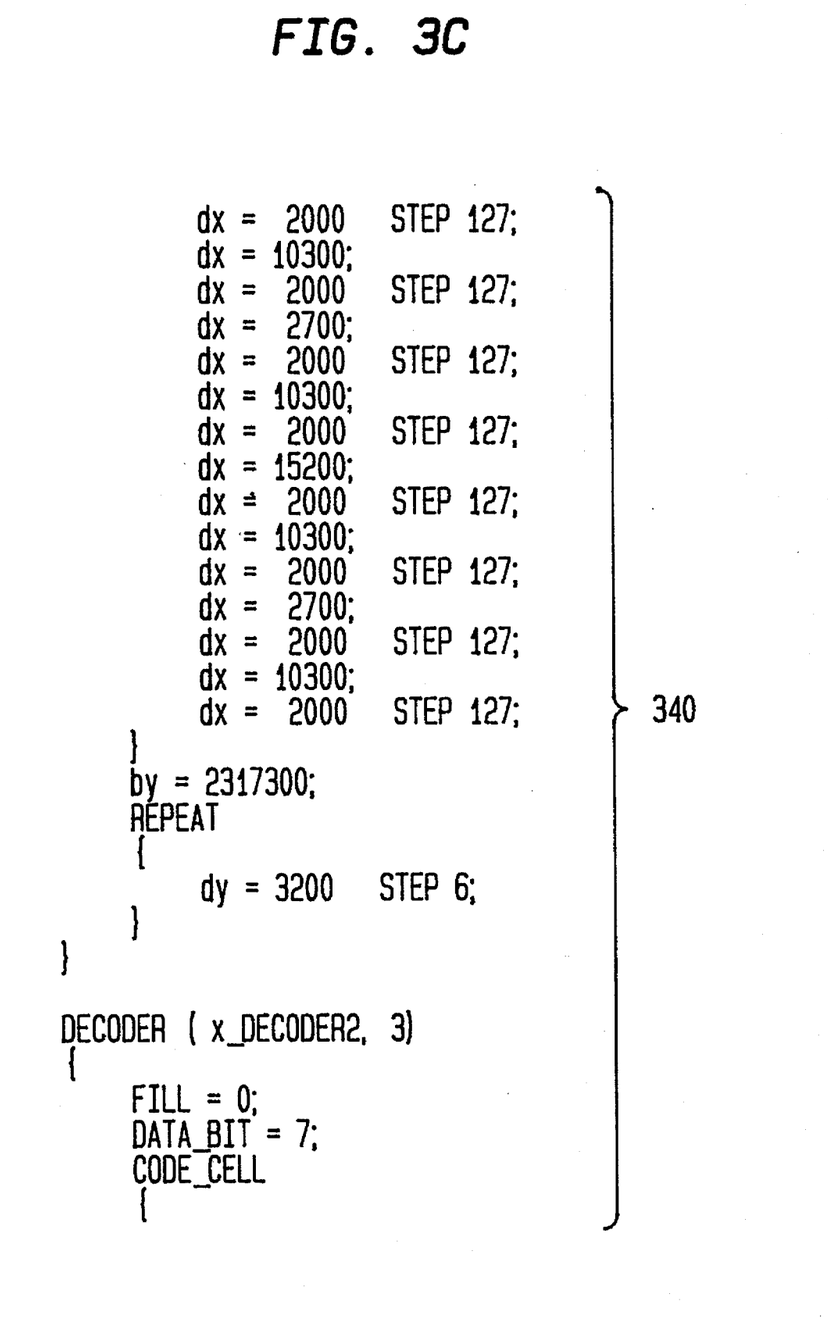

Illustratively, the instructions of FIG. 3 may be used by the ACPG apparatus 100 to produce the code layer corresponding to the design of the physical layout shown in FIG. 1. The instructions may be manually entered at the input device 140 or retrieved from one of the memories 120 or 130 or a combination thereof. The processor 110 sequentially retrieves and executes each instruction. In the course of executing an instruction, the processor 110 may retrieve previously stored information from the memories 120 and 130. The processor 110 also writes information relevant to the code layer (i.e., layout design or mapping) in the memories 120 and 130 in the course of executing instructions.

As shown in FIG. 3, the processor 110 first executes the instruction "scale=1000;" which causes the processor 110 to set an internal measurement parameter (e.g., stored in the main memory 130) to 1 μm. The processor 110 then executes the instruction "window (150000, 150000, 2520000, 3740000);". In response to this instruction, the processor 110 sets internal parameters for defining a window in which the processor 110 designs the layout. Then, the processor 110 executes the instruction "STRING {logo_string(46, 1398000, 3705000, 1650000, 3730000}" for purposes of retrieving a logo from the disk memory 120 and placing it in the design of the layout.

The processor 110 then executes the instruction "code (NA5209xxx, 0, 0)". This instruction is a label designating that all of the instructions 310 are part of a memory array named NA5209xxx. Next, the processor 110 executes the instruction "fill=0;". In response to this instruction, the processor 110 sets an internal parameter for use in translating the data to be stored in the ROM IC to the ROM IC layout design 10.

The processor 110 then executes the instruction "address_no=17;". This causes the processor 110 to set an internal parameter to indicate that there are 17 address bits. Next, the processor 110 executes the instruction "data_bit=8;" which causes the processor 110 to set an internal parameter to indicate that there are 8 data bits per data word. Thereafter, the processor 110 executes the instruction "code_cell {ROM(16, 2100, 1600)}". This causes the processor 110 to retrieve a particular kind of polygon specification, i.e., a 2100 μm×1600 μm ROM rectangle, from the memories 120 or 130. Furthermore, this instruction causes the processor 110 to set an internal parameter indicating that the polygons (each of which corresponds to a cell) are to be placed on the $16^{th}$ physical IC chip layer of the layout.

The processor 110 then executes the instruction "X(0–6, B(0–7));". As mentioned above, 7 of the address bits (bits 0–6) are decoded by the X decoder 20 to access an eight bit data word which has one bit in each of eight consecutive areas b0–b7. This instruction causes the processor 110 to set appropriate internal parameters to indicate that in the x (horizontal) direction, there are $2^7$=128 cells (for storing one particular bit of each eight bit data word) in each of eight consecutive areas b0–b7. Next, the processor 110 executes the instruction "Y(F(C(7–14)), 15, 16);" which causes the processor 110 to set internal parameters regarding the design of the layout of the cells in the y (vertical) direction. As mentioned above, 10 of the 17 address bits (bits 7–16) are decoded by the Y decoder 30 for purposes of enabling an appropriate row of cells (e.g., 41-1, 44-2, etc.) in the memory array 40. However, in the layout design of the ROM IC 10, the memory array 40 is segregated into four sub-arrays 41–44. A row of cells in each particular sub-array 41–44 is addressed (selected) depending on 8 of the bits decoded by the Y decoder 30 (in particular bits, 7–14 of the 17 address bits). This is specified by the "C(7–14)" portion of the instruction. Furthermore, the portion of the instruction "15, 16" specifies that bits 15 and 16 of the 17 bit address are decoded by the Y decoder for selecting a particular sub-array 41–44. Lastly, the use of "F" indicates that the vertical addressing order of the rows should flip or alternate between bottom-up to top-down depending on bits 15 and 16. This causes the processor 110 to set internal parameters to indicate that the addressing of rows of cells in the sub-arrays 41 and 43 is top-down and that the addressing of rows of cells in the sub-arrays 42 and 44 is bottom-up.

Thereafter, the processor 110 executes the instruction "bx=280500;". This causes the processor 110 to set an internal start coordinate parameter in the x (horizontal) direction to 280500 μm (from a presumed left hand side origin). The processor 110 then executes a series of instructions 320 enclosed between the braces of a "repeat" instruction for defining spaces separating the cells in the x (horizontal) direction. A first instruction "dx=2000 step 127;" causes the processor 110 to set internal parameters for separating each the cells in the first area b0 by 2000 μm. The portion of the instruction "step 127" causes the spacing 2000 μm to be repeated a total of 127 times (there are a total of 127 spaces separating each cell of the 128 cells of the area b0 from its neighbors). Next, the processor 110 executes the instruction "dx=10300;". This causes the processor 110 to set an internal parameter for separating the area b0 from the area b1 by a distance of d1=10300 μm.

Next, the processor 110 then executes the next instruction "dx=2000 step 127;" for separating each of the cells of the next area b1 from each other by 2000 μm. The processor 110 then executes the instruction "dx=2700;" for separating the area b1 from the area b2 by a distance d2=2700 μm. The processor 110 sequentially executes each of the rest of the instructions 320 in a like manner. In particular, the areas b2 and b3, b4 and b5, and b6 and b7 are separated from each other by the distance d1=10300 μm, the areas b5 and b6 are separated from each other by the distance b2=2700 μm, and the areas b3 and b4 are separated by the distance d3=15200 μm.

Thereafter, the processor 110 executes the instruction "by=1907700;" for causing the processor 110 to set an internal starting point parameter in the y (vertical) direction to 19077700 μm from some origin (from the top). Then as with the instructions 320, the processor 110 sequentially executes the instructions 330 enclosed between the braces of the next instruction "repeat". These instructions 330 cause the processor 110 to set internal parameters for separating the cells of each sub-array 41–44 by spaces in the y (vertical) direction. In particular, within each sub-array, 256 rows of cells are vertically separated from each other by 255 spaces of 1600 μm. Furthermore, the sub-arrays 41 and 42, and 43 and 44 are separated from each other by a distance d4=55800 μm. Likewise, the sub-arrays 42 and 43 are separated from each other by the distance d5=24800 μm.

Following the execution of the instructions 330, the processor 110 then illustratively executes other instructions 340 for mapping and designing the layout of the X decoder 20 and Y decoder 30. As shown, these instructions 340 have a similar format as the above-described instructions. As may be appreciated, the polygons for the X decoder 20 and Y decoder 30 correspond to cells appropriate for the X decoder 20 or Y decoder 30. That is, the X decoder 20 and Y decoder 30 do not contain storage cells but rather contain cells with logic gates suitable for receiving appropriate address bits and outputting a signal on a corresponding word or bit line.

Using the parameters as set above, the processor 110 generates a code layer including a mapping relationship between addresses and corresponding cells. In creating the mapping relationship, the processor 110 simply generates one or more formulas which the processor 110 can evaluate in determining the correspondence between each cell and its corresponding address. A file containing the inputted data to be stored on the ROM IC chip 10 is inputted to the processor 110, e.g., from the disk memory 120. The processor 110 can then utilize the mapping relationship to introduce variations into the design of the layout of the cells depending on the data to be stored by the ROM IC chip 10. As mentioned above, there are many choices for introducing variations depending on the cell architecture.

The processor 110 also generates a design of the layout (i.e., geometrical description of the arrangement and location of components and regions) of the physical layer or layers, in this case, the layer 16, of the ROM IC chip 10. Advantageously, the processor 110 generates an array of records, wherein each record stores the coordinates (in relation to the assumed origin) of the points of each polygon corresponding to each cell of the X decoder 20, Y decoder 30 and memory array 40. This array may be stored in a file in the disk memory 120.

The generation of the layout design is preferably performed simultaneously with the programming of the ROM IC. For example, suppose the particular cell architecture is used which provides a transistor in each cell that stores a logic '1' bit and no transistor in each cell that stores a logic '0' bit. In such a case, the processor 110 can systematically design the cell layout and introduce variations therein one cell at a time. The processor 110 starts with the first cell and determines the locations of each point of the corresponding polygon. The processor 110 also examines the data to be programmed in the cell (using the mapping relationship to match the cell to its corresponding data). If the cell is to store a logic '1' bit, the processor 110 illustratively stores the polygon point coordinates for that particular cell as described above. If the cell is to store a logic '0' bit, the processor 110 does not store polygon point coordinates for that particular cell (i.e., the processor 110 deletes the cell). Rather, the processor 110 simply accounts for the space that would have been occupied by that cell and processes the next cell. The processor 110 consecutively processes each cell in this fashion until the design of the layout (and simultaneous programming) is complete.

After programming, the code layer is complete. The code layer can be merged with the design of the layout of the other physical layers of the ROM IC chip to form a complete ROM IC chip layout design. The completed layout design may be printed on a printer 190 or outputted to another apparatus used in the design, evaluation or fabrication of an IC chip 200. Advantageously, the processor 110 is capable of outputting the IC chip layout design according to the well known GDS II stream format. This IC chip layout design may be examined with the assistance of a layout editor or manually examined by viewing a printout of the complete design (or portions thereof). The ROM IC chip can then be fabricated using well known IC fabrication steps (i.e., etching, photolithography, ion implantation, etc.) according to the completed layout design. In particular, the physical layer 16 is formed with cells located approximately where their corresponding polygons are located in the layout design. Furthermore, the cells are physically formed in the layer 16 according to the variations in the design as introduced by the programming of the data.

Figure 4:
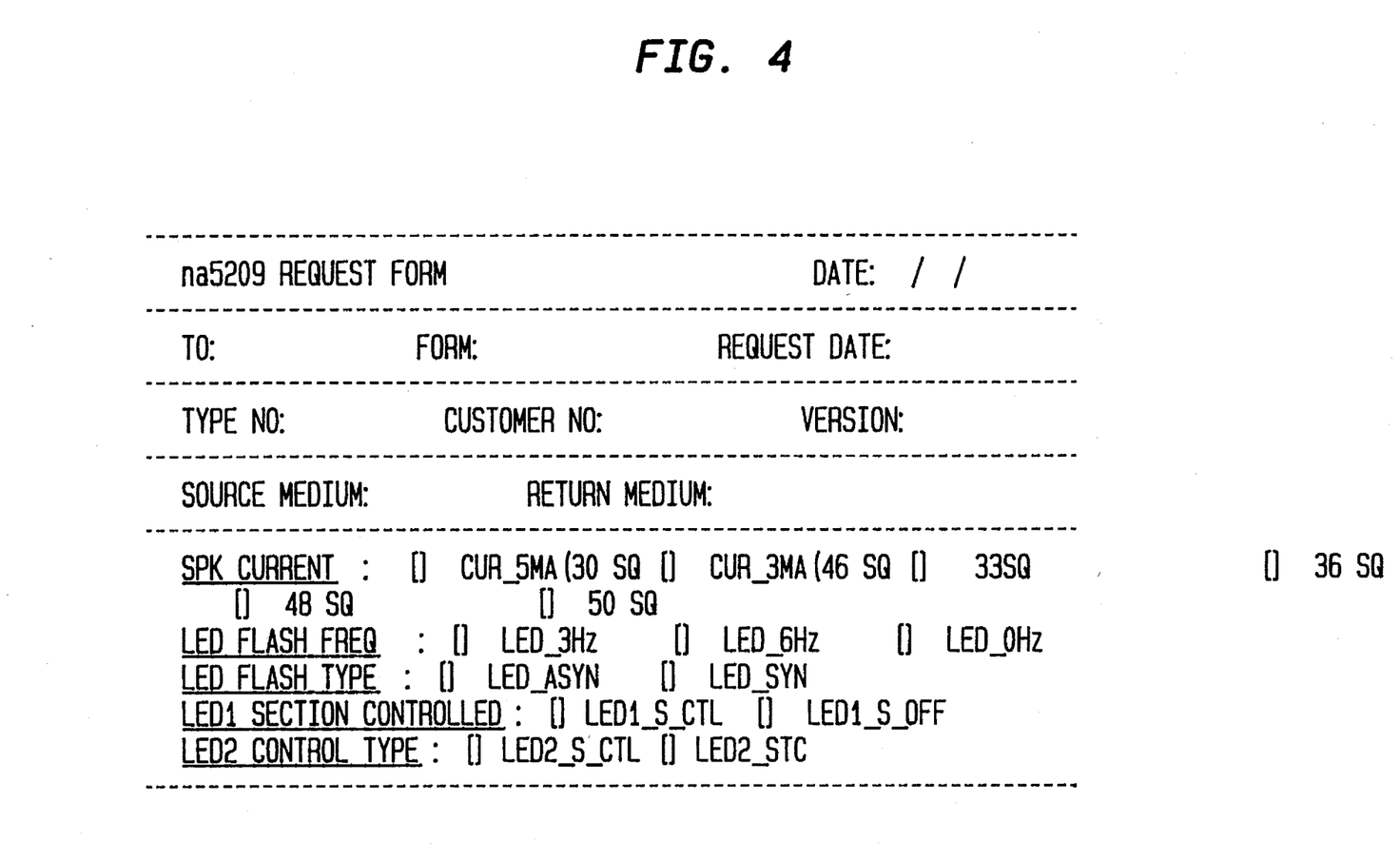
FIG. 4 shows an illustrative request form which may be processed by the automatic code pattern generator apparatus of FIG. 2.
Figure 5:
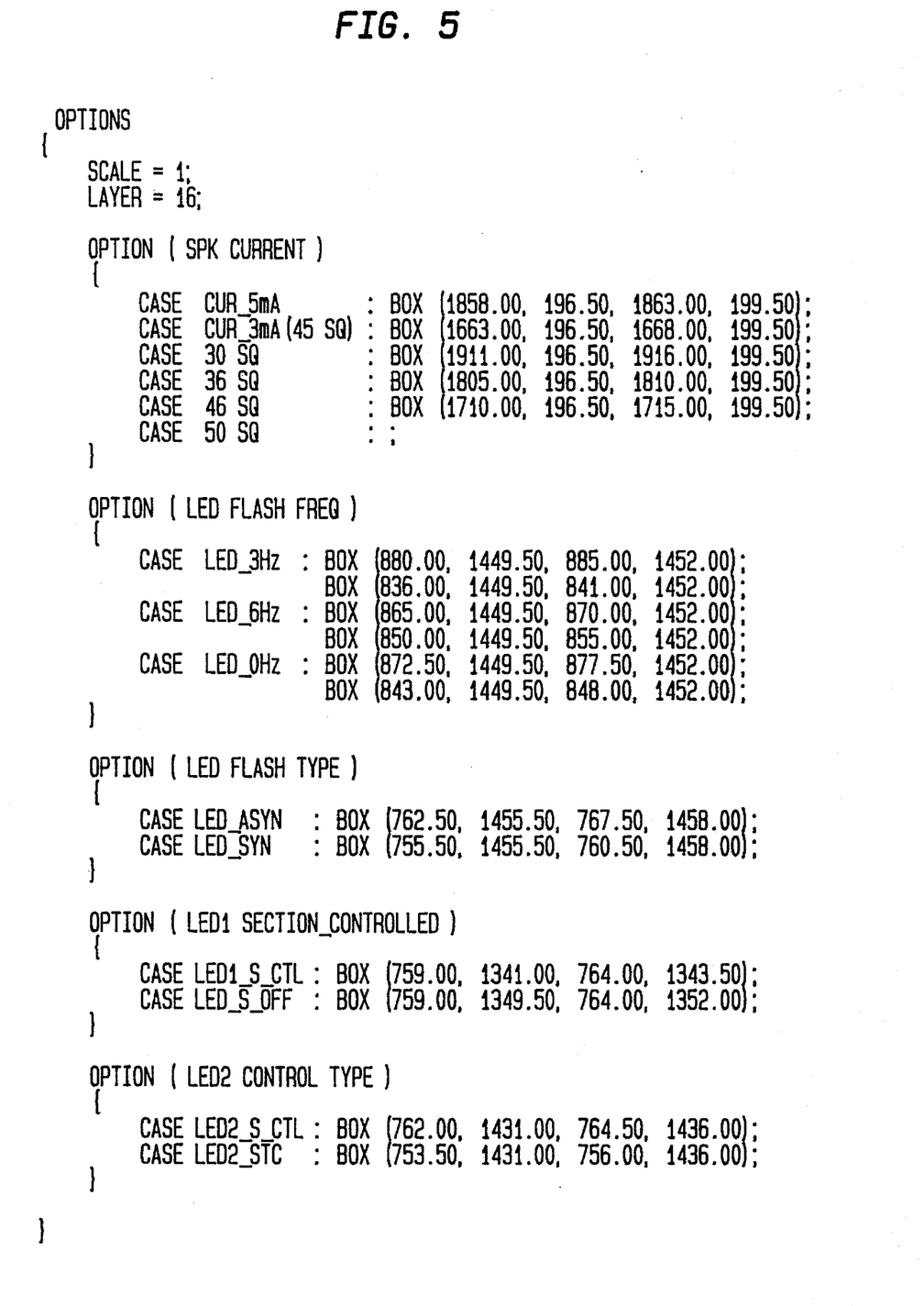
FIG. 5 shows an option file construct which may be used in laying out optional components and regions on the code layer.

The ACPG apparatus 100 may be enhanced to provide customized optional regions or components on the pre-programmed IC chip layers. FIG. 4 shows an option request form 400 which may be completed by a user (customer). The user checks off desired options on the form 400. This form 400 is then illustratively scanned in by the optical scanner 180 (FIG. 2) of the ACPG apparatus 100. In response to options checked off by the user, the processor 110 selects, from an options file stored in the disk memory 120, one or more polygons corresponding to the checked off options. FIG. 5 shows an illustrative options file corresponding to the form 400 of FIG. 4. As shown in FIG. 5, the options are hierarchically organized, i.e., each different kind of option (e.g., speaker current, LED flash frequency, LED flash type, etc.) has several choices which are listed as "cases" within the "option". For instance, the user can choose one of three different types of LED flash frequencies, namely, 3 Hz, 6 Hz and 0 Hz. Two polygons identified by "BOX" are defined for each case of the LED flash frequency option. Thus, the processor 110 would select the appropriate pair of polygons corresponding to the flash frequency selected by the user. The processor 110 places the selected polygons in the design of the layout at the specified location on the appropriate layer.

In short, an ACPG apparatus is disclosed for designing the layout a pre-programmed IC chip. The ACPG apparatus includes a processor which receives a plurality of instructions defining the layout of at least one regularly repeated or ordered pattern of cells on one or more physical layers of the pre-programmed IC chip. Included in these instructions is at least one instruction defining a polygon specification for each of the cells and at least one instruction specifying a regular repeated pattern of the cells on the physical layers of the IC chip. In response to these instructions, the processor generates a code layer including a design of the layout of the polygons on the physical layers of the IC chip according to the regularly ordered pattern of cells. The code layer also includes a mapping relationship between each cell, i.e., its location on the physical layer, and its address. The processor can also program the cells, i.e., introduce variations into the cells, depending on information indicating in which cells a variation should occur. The information illustratively includes addresses specifying cells and data indicating whether or not a variation should be introduced. The processor uses the mapping relationship to locate corresponding cells to be varied from the addresses included in the information. The processor then introduces variations into the cells depending on the included data.

Finally, the invention has been described above with reference to illustrative embodiments. Those having ordinary skill in the art may devise other embodiments without departing from the spirit and scope of the following claims.

We claim:

1. An apparatus for generating a code layer physical layout of a pre-programmed device containing at least one two-dimensional array of addressed, identical cells to be varied comprising:

a processor which responds to:
   (1) one or more instructions specifying a single, identical polygon to be associated with each addressed cell of a given one of said two-dimensional arrays, and
   (2) at least one instruction specifying at least one two-dimensionally arrayed pattern of repetitions of said single polygon, by forming a design of said code layer physical layout, said design formed by said processor locating said repetitions of said single polygon at specific locations of said given two-dimensional array, which locations are specified by said instructions, said processor also generating a mapping relation, from said at least one instruction specifying said at least one two-dimensional arrayed pattern, which mapping relation relates each polygon of said design with the address of said associated addressed cell of said polygon.

2. The apparatus of claim 1 wherein said processor responds to said at least one instruction specifying said at least one two-dimensional arrayed pattern by regularly varying a spacing within a particular row or column direction of said two-dimensional arrayed pattern between adjacent polygons of said design.

3. The apparatus of claim 1 wherein said processor programs said pre-programmed device with a program containing one bit corresponding to each addressed cell by introducing a variation to said polygons of said design, wherein each polygon of said design associated with an addressed cell corresponding to the same logic bit value is varied in an identical manner.

4. The apparatus of claim 3 wherein said processor determines which polygon of said design to vary in programming said device by translating an address of a bit of said program using said mapping relation to a particular one of said polygons associated with a cell that corresponds to said translated address.

5. The apparatus of claim 1 wherein said processor merges said design of said layout with a design of a layout of other layers of said pre-programmed device to form a completed layout design.

6. The apparatus of claim 1 further comprising a fabrication device which fabricates at least part of said pre-programmed device according to said design of said layout.

7. The apparatus of claim 1 wherein said processor responds to instructions specifying:

(a) the number of cells in each row in the x direction of said layout,
   (b) the number of cells in said x direction that correspond each data word addressed by each unique address,
   (c) the number of rows of cells in the y direction of said layout and the number of sub-arrays into which said rows are organized, and
   (d) a plurality of different regularly occurring spacings between cells within each row, between each row in each sub-array and between each sub-array, by locating one polygon for each of said cells in each of said rows in each of said sub-arrays at locations that accord with said regularly occurring spacings.

8. A process for fabricating a code layer physical layout of a pre-programmed device containing at least one two-dimensional array of addressed, identical cells to be varied comprising the steps of:

(a) using a processor, receiving
   (1) one or more instructions specifying a single, identical polygon to be associated with each addressed cell of a given one of said two-dimensional arrays, and
   (2) at least one instruction specifying at least one two-dimensionally arrayed pattern of repetitions of said single polygon, (b) using said processor, forming a design of said code layer physical layout, by locating said repetitions of said single polygon at specific locations of said given two-dimensional array, which locations are specified by said instructions, and (c) generating a mapping relation, from said at least one instruction specifying said at least one two-dimensional arrayed pattern, which mapping relation relates each polygon of said design with the address of said associated addressed cell of said polygon.

9. The process of claim 8 further comprising the step of:
   (d) using said processor, in response to said at least one instruction specifying said at least one two-dimensional arrayed pattern, regularly varying a spacing within a particular row or column direction of said two-dimensional arrayed pattern between adjacent polygons of said design.

10. The process of claim 8 further comprising the step of:
    (d) using said processor, programming said pre-programmed device with a program containing one bit corresponding to each addressed cell by introducing a variation to said polygons of said design, wherein each polygon of said design associated with an addressed cell corresponding to the same logic bit value is varied in an identical manner.

11. The process of claim 10 further comprising the step of:
    (e) using said processor, determining which polygon of said design to vary in programming said device by translating an address of a bit of said program using said mapping relation to a particular one of said polygons associated with a cell that corresponds to said translated address.

12. The process of claim 8 further comprising the step of:

(d) using said processor, merging said design of said layout with a design of a layout of other layers of said pre-programmed device to form a completed layout design.

13. The process of claim 8 further comprising the step of:

(d) fabricating at least part of said pre-programmed device according to said design of said layout.

14. The process of claim 8 further comprising the step of:

(d) using said processor, receiving instructions specifying:

(1) the number of cells in each row in the x direction of said layout, (2) the number of cells in said x direction that correspond each data word addressed by each unique address, (3) the number of rows of cells in the y direction of said layout and the number of sub-arrays into which said rows are organized, and (4) a plurality of different regularly occurring spacings between cells within each row, between each row in each sub-array and between each sub-array, and (e) using said processor, locating one polygon for each of said cells in each of said rows in each of said sub-arrays at locations that accord with said regularly occurring spacings.

* * * * *